United States Patent
Kerr et al.

(10) Patent No.: US 9,841,481 B2
(45) Date of Patent: Dec. 12, 2017

(54) MULTISLICE ACQUISITION WITH INCOHERENT ALIASING

(71) Applicant: The Board of Trustees of the Leland Stanford Junior University, Palo Alto, CA (US)

(72) Inventors: Adam B. Kerr, Menlo Park, CA (US); John M. Pauly, Stanford, CA (US); Kangrong Zhu, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 911 days.

(21) Appl. No.: 14/254,506

(22) Filed: Apr. 16, 2014

(65) Prior Publication Data

US 2015/0301145 A1    Oct. 22, 2015

(51) Int. Cl.
  *G01R 33/561*    (2006.01)
  *G01R 33/483*    (2006.01)
  *G01R 33/34*     (2006.01)
  *G01R 33/56*     (2006.01)

(52) U.S. Cl.
  CPC ...... *G01R 33/5611* (2013.01); *G01R 33/4835* (2013.01); *G01R 33/5616* (2013.01)

(58) Field of Classification Search
  CPC ............ G01R 33/4835; G01R 33/4833; G01R 33/5611; G01R 33/56509; G01R 33/483
  USPC .................................................. 324/300–322
  See application file for complete search history.

(56) References Cited

U.S. PATENT DOCUMENTS

| | | | |
|---|---|---|---|
| 6,853,191 B1* | 2/2005 | Miller | G01R 33/56509 324/307 |
| 7,002,344 B2 | 2/2006 | Griswold et al. | |
| 8,405,395 B2 | 3/2013 | Setsompop et al. | |
| 2004/0222794 A1 | 11/2004 | Griswold et al. | |
| 2008/0197842 A1* | 8/2008 | Lustig | G01R 33/561 324/307 |
| 2011/0096092 A1 | 4/2011 | Griswold et al. | |
| 2011/0254548 A1* | 10/2011 | Setsompop | G01R 33/4835 324/309 |
| 2013/0099784 A1 | 4/2013 | Setsompop et al. | |

(Continued)

OTHER PUBLICATIONS

Notice of Allowance dated Jan. 2, 2014 from U.S. Appl. No. 12/603,758.

*Primary Examiner* — Melissa Koval
*Assistant Examiner* — Rishi Patel
(74) *Attorney, Agent, or Firm* — Beyer Law Group LLP

(57) ABSTRACT

A method for producing images of a subject with a MRI system is provided. A radio frequency (RF) excitation field in combination with a slice-select magnetic gradient field along a slice-select direction is provided. At least one readout magnetic field gradient is established along a frequency-encoding direction and at least one phase encoding magnetic field gradient along a phase-encoding direction. The RF field or magnetic field gradient is manipulated along a slice-select direction in order to impart a sequence of phase shifts to the formed echo signals such that image data corresponding to an at least one adjacent slice location is incoherently aliased across a field-of-view (FOV) of a current slice location. Image data is acquired indicative of the formed echo signals. A plurality of images of the subject is reconstructed.

17 Claims, 9 Drawing Sheets

(56) References Cited

U.S. PATENT DOCUMENTS

2016/0018499 A1* 1/2016 Bornert ............... G01R 33/385
 324/309
2016/0341807 A1* 11/2016 Bilgic ............... G01R 33/4835

* cited by examiner

MULTISLICE ACQUISITION WITH INCOHERENT ALIASING

GOVERNMENT RIGHTS

This invention was made with Government support under contracts CA159992, EB008108, and EB015891 awarded by the National Institutes of Health. The Government has certain rights in this invention.

BACKGROUND OF THE INVENTION

This invention relates generally to magnetic resonance imaging (MRI).

Magnetic resonance imaging (MRI) is a widely used imaging modality which provides excellent soft tissue contrast and which does not impose any hazard of ionizing radiation. MRI acquisitions can be significantly sped up by parallel imaging (PI) techniques which acquire aliased signal from multiple spatial locations and later separate the individual locations in the image reconstruction process. PI utilizes multicoil receive arrays for data acquisition. The signal measured by a particular coil is the underlying MR signal weighted by the receive sensitivity of that coil. The multiple measurements taken by the multiple coils in a coil array are used in the reconstruction to resolve the spatial aliasing.

SUMMARY OF THE INVENTION

In accordance with a manifestation of the invention, a method for producing a plurality of images of a subject with a magnetic resonance imaging (MRI) system is provided. A radio frequency (RF) excitation field in combination with a slice-select magnetic gradient field along a slice-select direction is provided to a portion of a subject by the MRI system that includes a plurality of slice locations, the plurality of slice locations including a current slice location and at least one adjacent slice location. At least one readout magnetic field gradient is established by the MRI system along a frequency-encoding direction and at least one phase encoding magnetic field gradient along a phase-encoding direction following the application of the RF excitation field in order to form at least one echo signal. The RF field or magnetic field gradient is manipulated along a slice-select direction in order to impart a sequence of phase shifts to the formed echo signals such that image data corresponding to the at least one adjacent slice location is incoherently aliased across a field-of-view (FOV) of the current slice location. Image data is acquired with an array of RF receiver coils that forms a part of the MRI system indicative of the formed echo signals. A plurality of images of the subject is reconstructed from the acquired image data, each of the plurality of images depicting the subject at a corresponding one of the plurality of slice locations.

In another manifestation of the invention a method for producing a plurality of images of a subject with a magnetic resonance imaging (MRI) system is provided. A radio frequency (RF) excitation field is applied by the MRI system in combination with a slice-select magnetic gradient field along a slice-select direction to a portion of a subject that includes a plurality of spectral components, the plurality of spectral components including a current spectral component and at least one adjacent spectral component. At least one readout magnetic field gradient is established by the MRI system along a frequency-encoding direction and at least one phase encoding magnetic field gradient along a phase-encoding direction following the application of the RF excitation field in order to form at least one echo signal. The RF field is manipulated in order to impart a sequence of phase shifts to the formed echo signals such that image data corresponding to the at least one adjacent spectral component is incoherently aliased across a field-of-view (FOV) of the current spectral component. Image data is acquired by an array of RF receiver coils of the MRI system indicative of the formed echo signals. A plurality of images of the subject is reconstructed from the acquired image data, each of the plurality of images depicting the subject at a corresponding one of the plurality of spectral components.

The invention and objects and features thereof will be more readily apparent from the following detailed description and appended claims when taken with the drawings.

DETAILED DESCRIPTION OF ILLUSTRATED EMBODIMENTS

Figure 1:
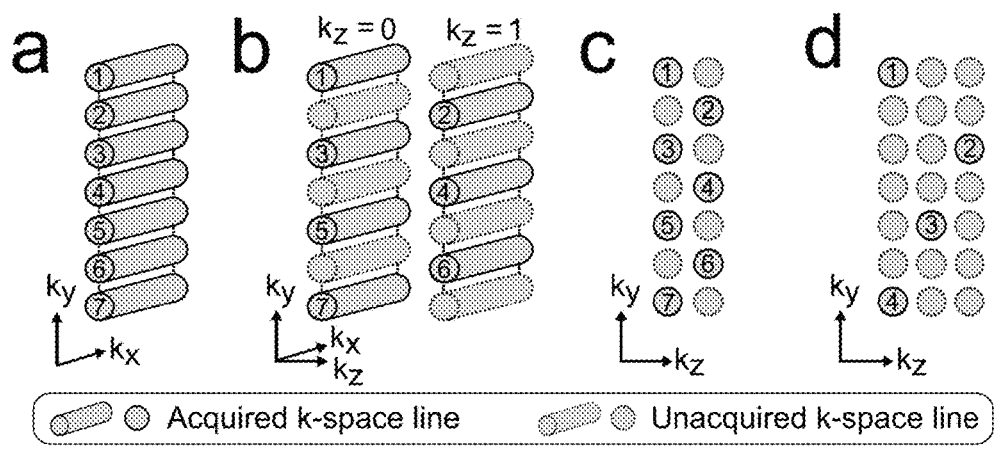
FIGS. 1a-d illustrate the relationship between the 2D and 3D views of the k-space data acquired in a CAIPI-type acquisition.

A research focus for PI has been the simultaneous multislice (SMS) acquisition technique, which has been demonstrated most for brain imaging, and has also been applied to imaging other organs. In SMS acquisition, multiple slices are first excited by a multiband radiofrequency (RF) pulse, then the slice-aliased k-space data are acquired, and finally the individual slices are reconstructed either by the sensitivity encoding for fast MRI (SENSE) reconstruction or by the generalized autocalibrating partially parallel acquisitions (GRAPPA) reconstruction.

The controlled aliasing in parallel imaging results in higher acceleration (CAIPIRINHA) and blipped-controlled aliasing in parallel imaging (blipped-CAIPI) techniques are proposed to alleviate the g-factor penalty in SMS reconstruction. CAIPIRINHA and blipped-CAIPI utilize the same data acquisition scheme, which will be referred to as the "CAIPI-type" acquisition. In a CAIPI-type acquisition, different slices have different linear phase ramps introduced in the phase encoding k-space ($k_y$) dimension so that each slice is shifted by a different amount in the phase encoding (PE) dimension in the slice-aliased image. The linear phases along $k_y$ are introduced by manipulation of the phase of the multiband RF pulse in CAIPIRINHA, and by slice select gradient ($G_z$) blips in blipped-CAIPI. Single-shot echo planar imaging (EPI) cannot use RF phase manipulation, but must apply $G_z$ blips concurrently with the phase encoding gradient ($G_y$) blips to achieve a CAIPI-type acquisition, because it reads out all of the k-space data after a single RF excitation.

The slice shifting used by the CAIPI-type data acquisition scheme leads to coherent aliasing of the simultaneously excited slices. In other words, the coil sensitivity patterns are shifted in a coherent manner to control which pixels alias together.

An embodiment of the invention provides a Multislice acquisition with InCoherent Aliasing (MICA) technique as a new SMS imaging technique. Instead of using slice shifting to create coherent aliasing, MICA encodes the simultaneous slices in a pseudo-random manner such that only incoherent slice-aliasing exists in the acquired data. MICA is advantageous over the CAIPI-type acquisition in the following aspects. First, MICA retains more signal to noise ratio (SNR) than CAIPI in the reconstructed SMS images for certain scan prescriptions. Second, MICA can be generalized to introduce aliasing incoherency in the time dimension by varying the encoding scheme from time point to time point in a time series acquisition. Third, MICA allows non-linear encoding along the slice direction when the encoding is introduced by the manipulation of the multiband RF phase. Fourth, the incoherent aliasing may lead to better compressed sensing-type reconstructions.

Technical Description

Although conventionally viewed as a 2D problem, SMS parallel imaging can be reformulated into a 3D problem. We start the reformulation from the CAIPI-type data acquisition, in which the $N_s$ simultaneous slices are often distributed equidistantly in the 2D aliased image. To shift the z-th (z=0, 1, ..., $N_s$-1) slice by z×$FOV_y$/$N_s$ in the PE direction, where $FOV_y$ is the field of view (FOV) in the PE direction, a phase of -2πnz/$N_s$ needs to be introduced to the n-th $k_y$ line for the z-th slice. The acquired k-space signal for the n-th $k_y$ line is $$s(k_x, k_y = n) = \Sigma_x \Sigma_y \left[\Sigma_{z=0}^{N_s-1} m(x, y, z)e^{-i2\pi nz/N_s}\right]e^{-i2\pi\left(\frac{k_x x}{N_x} + \frac{k_y y}{N_y}\right)} \quad [1]$$

$$(n = 0, 1, \ldots, N_y - 1),$$

where x is the readout direction, y is the PE direction, m(x, y, z) is the magnetization of the z-th slice at position (x, y), and $N_x$, $N_y$ are the matrix size in x and y. It is worth noting that $\exp(-i2\pi nz/N_s) = \exp(-i2\pi(n \bmod N_s)z/N_s)$ (n=0, ..., $N_y$-1; z=0, ..., $N_s$-1), where mod is the modulus operation. Let $k_z$=(n mod $N_s$), Eq. 1 is equivalent to $$s(k_x, k_y = n, k_z = (n \bmod N_s)) = \quad [2]$$

$$\Sigma_x \Sigma_y \left[\Sigma_{z=0}^{N_s-1} m(x, y, z)e^{-i2\pi k_z z/N_s}\right]e^{-i2\pi\left(\frac{k_x x}{N_x} + \frac{k_y y}{N_y}\right)}$$

$$(n = 0, 1, \ldots, N_y - 1; k_z = 0, 1, \ldots, N_s - 1).$$

The right side of Eq. 2 clearly shows that the phases introduced to the $N_s$ excited slices are conducting an $N_s$-point Discrete Fourier Transform (DFT) encoding along the slice direction. The left side of Eq. 2 shows that the data are collected in the 3D k-space of the simultaneous slices. The $k_x$ dimension in the 3D k-space is fully sampled and the $k_y$-$k_z$ plane is undersampled. The n-th (n=0, ..., $N_y$-1) echo acquires the point ($k_y$(n)=n, $k_z$(n)=(n mod $N_s$)) on the $k_y$-$k_z$ plane. The CAIPI-type data acquisition is thus reformulated as a 3D acquisition.

FIGS. 1a-d illustrate the relationship between the 2D and 3D views of the k-space data acquired in a CAIPI-type acquisition. The k-space lines with the same numbering in FIGS. 1a-b represent the same data. The 2D view, shown in FIG. 1a is the projection along $k_z$ of the 3D view, shown in FIG. 1b. A 2-point DFT encoding is conducted on the simultaneous slices in this example. On the $k_y$-$k_z$ plane, the CAIPI-type acquisition takes samples along diagonal lines, as illustrated in FIG. 1c. Additional in-plane acceleration in a CAIPI-type acquisition corresponds to skipping sampled points on the $k_y$-$k_z$ plane. For example, three times slice-acceleration and two times in-plane acceleration are applied in the CAIPI-type undersampling scheme shown in FIG. 1d.

In the conventional 2D description of blipped-CAIPI, the shift between adjacent simultaneous slices is sometimes chosen to be $FOV_y$/N, where N≠$N_s$, to get better reconstruction performance. For example, a $FOV_y$/2 interslice shift can be employed for 3 simultaneous slices. Similarly to Eqs. 1-2, we can show that an interslice shift of FOV/N corresponds to an N-point DFT encoding on the simultaneous slices in the 3D view of the SMS acquisition. For example, k-space data from a simultaneous three-slice acquisition with $FOV_y$/2 interslice shift can be reformulated into a 3D k-space data set with two $k_z$ lines corresponding to a two-point DFT encoding. A CAIPI-type acquisition would still acquire data along diagonal lines on the $k_y$-$k_z$ plane as depicted in FIG. 1c. Since the value of N only affects how many $k_z$ lines there are but does not affect the undersampling pattern on the $k_y$-$k_z$ plane, we will assume N=$N_s$ for the rest of the specification and claims for simplicity of illustration.

SENSE Reconstruction for CAIPI

Basing on the 3D description of a CAIPI-type acquisition, a SENSE reconstruction can be conducted to reconstruct the individual slices.

As a first step a 1D inverse Fast Fourier Transform (FFT) is conducted along the fully sampled $k_x$ dimension to transform the 3D data in the $k_x$-$k_y$-$k_z$ space into the x-$k_y$-$k_z$ space. For each point x=$x_0$ along x, there exists an undersampled $k_y$-$k_z$ plane. Each acquired point on the $k_y$-$k_z$ plane is measured by one echo. The signal measured in the c-th coil by the n-th echo is $$s_{CAIPI}(x = x_0, k_y(n), k_z(n), c) = \quad [3]$$

$$\Sigma_{y=0}^{N_y-1} \Sigma_{z=0}^{N_s-1} m(x_0, y, z)S_c(x_0, y, z)e^{-i2\pi \frac{k_y y}{N_y}} e^{-i2\pi \frac{k_z z}{N_s}}$$

$$(n = 0, 1, \ldots, N_e - 1; c = 0, 1, \ldots, N_c - 1),$$

where m(x, y, z) is the magnetization in the x-y-z space, $S_c$(x, y, z) is the receive sensitivity of the c-th coil, the phase $-2\pi k_y y/N_y$ is for the DFT encoding along y, the phase $-2\pi k_z z/N_s$ is for the DFT encoding along z, $N_e$ is the total number of echoes which also equals the number of acquired points on the $k_y$-$k_z$ plane, and $N_c$ is the number of receive coils. In matrix form, Eq. 3 can be written as $$s_{CAIPI} = E_{CAIPI} m. \quad [4]$$

And Eq. 4 can be solved by the pseudoinverse of $E_{CAIPI}$.

$$m = \text{pinv}(E_{CAIPI}) s_{CAIPI}. \quad [5]$$

$s_{CAIPI}$ is a $N_e N_c \times 1$ vector containing the measured data in the x-$k_y$-$k_z$ space, $s_{CAIPI}$ ($x_0$, $k_y(n)$, $k_z(n)$, c), where n=0, . . . , $N_e$−1 is the echo index and c=0, . . . , $N_c$−1 is the coil index. m is an $N_y N_s \times 1$ vector containing the unknown magnetization m($x_0$, y, z), where y=0, . . . , $N_y$−1 and z=0, . . . , $N_s$−1. $E_{CAIPI}$ is a $N_e N_c \times N_y N_s$ encoding matrix which contains the coil sensitivities and the DFT encoding along y and z. Correspondingly, the pseudoinverse operation in Eq. 5 conducts a SENSE reconstruction, and decodes the DFT encoding along y and z. The 3D magnetization m(x, y, z) is reconstructed by performing Eq. 5 for each point along x.

Multislice Acquisition with Incoherent Aliasing (MICA)

Figure 2:
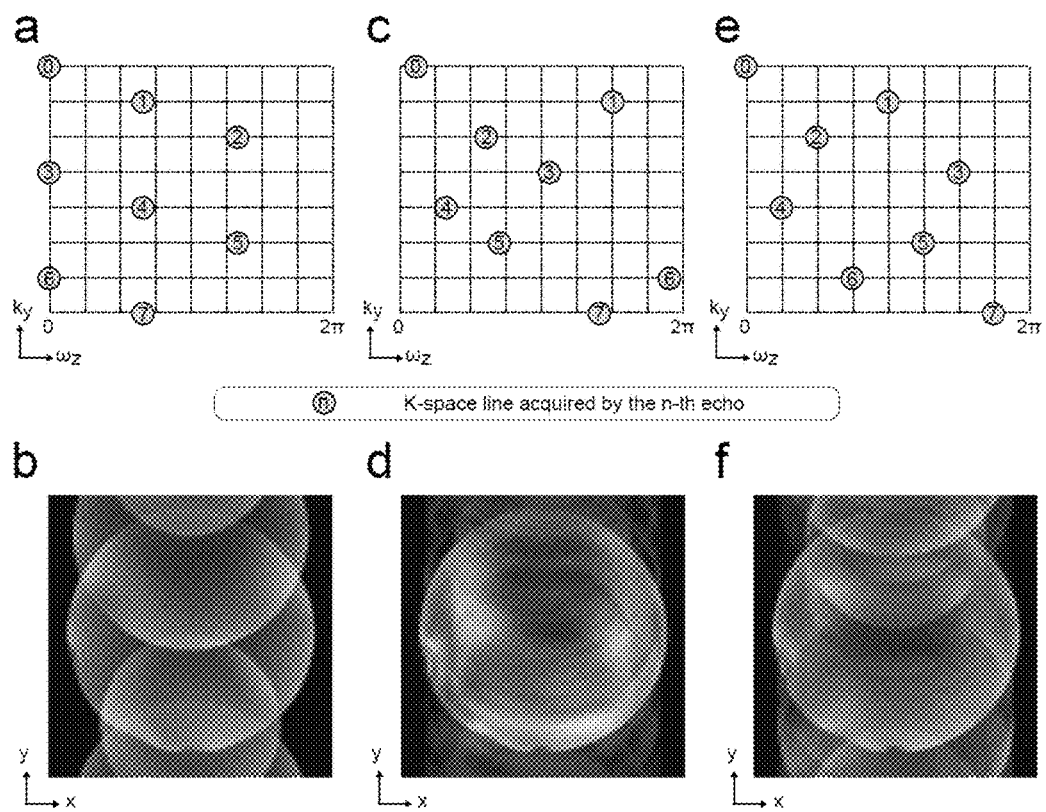
FIGS. 2a-f illustrate a comparison of the CAIPI and the MICA data acquisition schemes.

To facilitate understanding, FIGS. 2a-f illustrate a comparison of the CAIPI and the MICA data acquisition schemes for 3 simultaneous slices. FIGS. 2a, c, e illustrate the data acquisition pattern on the $k_y$-$\omega_z$ plane for the CAIPI-type acquisition, the random MICA acquisition, and the bit-reversed MICA acquisition, respectively. The numberings on the acquired k-space lines represent the echo indices. FIGS. 2b, d, f display the 2D view of the slice-aliased data for the CAIPI-type acquisition, the random MICA acquisition, and the bit-reversed MICA acquisition, respectively.

The CAIPI-type SMS data acquisition scheme encodes the simultaneous slices with an $N_s$-point DFT encoding, which is equivalent to sampling the frequency spectrum of the simultaneous slices at $N_s$ points, $2\pi k_z/N_s$ ($k_z$=0, 1 . . . $N_s$−1), as shown in FIG. 2a. The $k_y$ dimension is uniformly sampled. The 2D view of the CAIPI-type acquisition can be obtained by projecting the 3D k-space data along the normalized frequency ($\omega_z$, where $\omega_z \in [0, 2\pi]$) axis. In the 2D view, the slice-aliased image exhibits coherent slice-aliasing, as shown in FIG. 2b.

Instead of repeatedly sampling the $N_s$ DFT encoding frequencies, MICA uses each echo to sample a unique frequency in the frequency spectrum of the simultaneous slices, and the sampling is performed in a random manner. Two random sampling schemes are proposed here.

The first random sampling scheme depicted in FIG. 2c randomly or pseudo-randomly picks a frequency in the interval [0, $2\pi$] for each echo basing on a uniform probability density on [0, $2\pi$]. A 2D view of the MICA acquisition can be obtained by projecting the 3D k-space data along the $\omega_z$ axis. In the 2D view, the slice-aliased image show incoherent aliasing from the simultaneous slices, as depicted in FIG. 2d. This type of MICA acquisition will be referred to as the "random MICA".

The second random sampling scheme samples $N_e$ uniformly distributed frequencies on the interval [0, $2\pi$] in a bit-reversed order, where $N_e$ is the total number of echoes in the acquisition. The sampled frequencies can be written as $j2\pi/N_e$ (j=0, 1 . . . $N_e$−1). The bit-reversed ordering means that the n-th (n=0, 1, . . . $N_e$−1) echo samples the frequency $\omega_z(n) = B(n) 2\pi/N_e$, where B(n) is the index corresponding to n after a bit-reversal permutation is conducted on the index series 0, 1, . . . $N_e$−1. An example with 8 echoes is illustrated in FIG. 2e. The echo index series in the original ordering is n=0, 1, 2, 3, 4, 5, 6, 7. After a bit reversal permutation, the index series becomes B(n)=0, 4, 2, 6, 1, 5, 3, 7. Therefore the 0-th echo samples the frequency $\omega_z(0) = 0 \times 2\pi/8$, the 1st echo samples the frequency $\omega_z(1) = 4 \times 2\pi/8$, the 2nd echo samples the frequency $\omega_z(2) = 2 \times 2\pi/8$, and so on. The aliased image in the 2D view, as illustrated in FIG. 2f, exhibits incoherent aliasing from the simultaneous slices. This type of MICA acquisition will be referred to as the "bit-reversed MICA".

In MICA, additional in-plane acceleration corresponds to increasing the sampling interval in $k_y$ and reducing the number of echoes $N_e$. For example, for a MICA acquisition with a sampling interval of $\Delta k_y$ in $k_y$ and with 96 echoes, a 2 times in-plane acceleration will increase the sampling interval to $2\Delta k_y$ in $k_y$, and will decrease the number of echoes to 48.

Pulse Sequences for MICA

Figure 3:
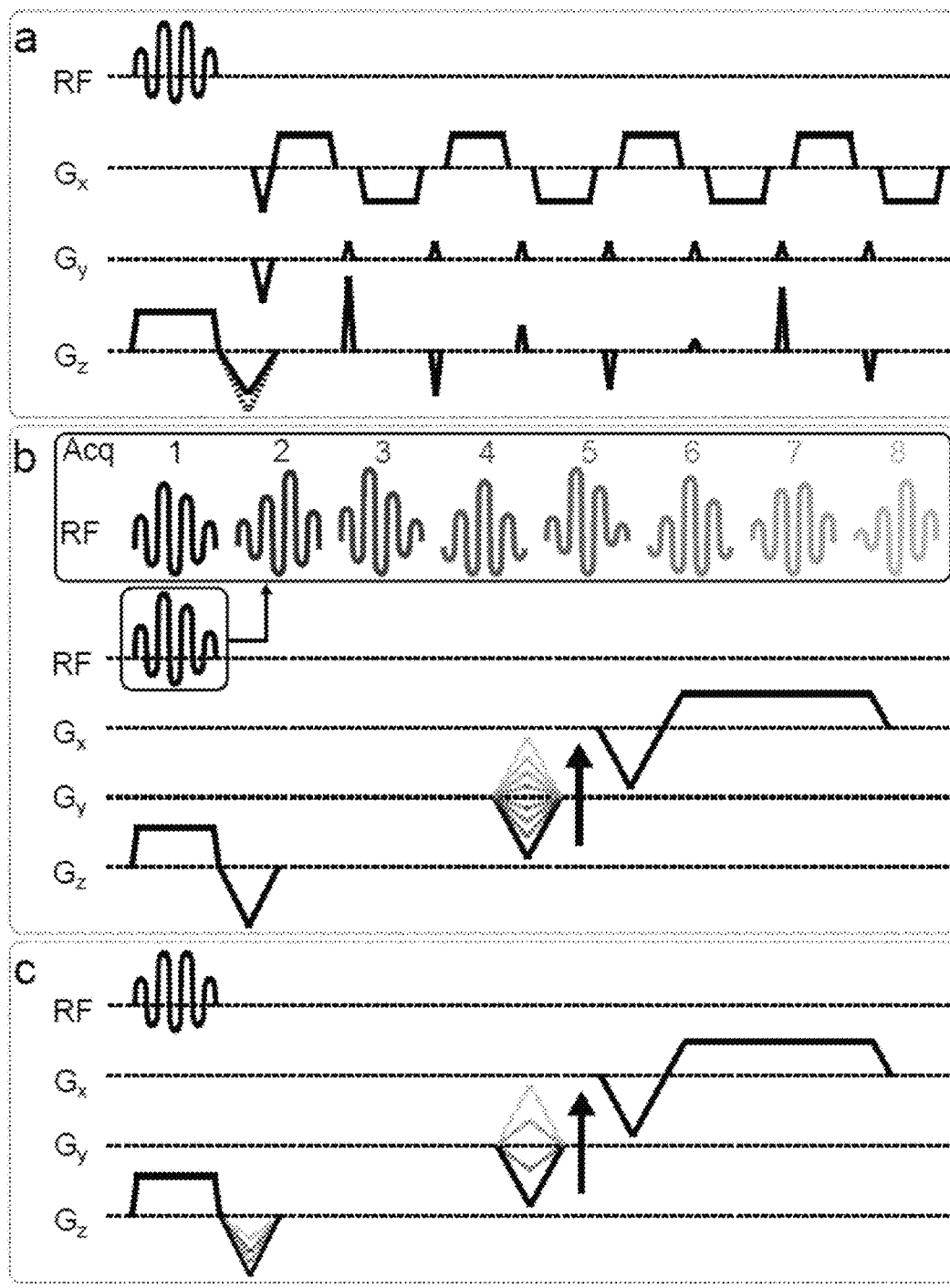
FIGS. 3a-c are schematic plots of MICA sequences.

FIGS. 3a-c are schematic plots of gradient echo MICA sequences. These plots show that the randomized encoding scheme in MICA, which leads to incoherent slice-aliasing, can be realized by three different methods.

First, in an EPI acquisition, the encoding along the slice direction can be carried out by $G_z$ blips that are played out concurrently with the $G_y$ blips, as depicted in FIG. 3a. The area of the slice-refocusing gradient can be modified to conduct the encoding needed for the first echo. Unlike those in blipped-CAIPI, the $G_z$ blips in MICA do not follow a periodic pattern. Both the amplitude and the polarity of a MICA $G_z$ blip may differ from that of the previous blip.

Second, the encoding along the slice direction in MICA can be conducted by modifying the multiband RF pulse to excite the desired phase for each of the simultaneously excited slices. FIG. 3b displays an example of a single-echo gradient echo sequence, in which the multiband RF pulse is manipulated for each one of the eight acquisitions (denoted as Acq 1~8) to carry out the MICA encoding. The encoding phase added to the simultaneous slices by the multiband RF pulse does not necessarily have a linear dependency on the slice index. Non-linear phase across the simultaneous slices can also be applied.

Third, the area or amplitude of the slice-refocusing gradient can be manipulated to carry out the encoding for MICA. An example of a single-echo gradient echo sequence with four acquisitions is shown in FIG. 3c. Each shade in this plot represents one acquisition. The amplitude of the phase-encoding gradient increases monotonically, while the amplitude of the slice-refocusing gradient changes in a randomized order. For any two adjacent acquisitions, the difference between the areas of the phase encoding gradients is constant, while the difference between the areas of the slice-refocusing gradients is varying. FIG. 3c corresponds to a MICA undersampling scheme similar to the one in FIG. 2c.

MICA is applicable to simultaneous multislice spin echo sequences, in which the encoding along the slice direction can be carried out by any of the above three methods. In addition to the phase of the multiband excitation pulse, the phase of the multiband spin refocusing pulse can also be manipulated to encode the simultaneous slices. The amplitude or area of the crusher gradients may also be changed to impart the encoding phase along the slice direction to the excited slices.

Additional spin preparation or encoding, such as diffusion encoding, flow encoding, phase contrast preparation, Bloch-Siegert RF pulses for B1 mapping, and $T_2$ preparation, are compatible with MICA.

Incoherent Slice-Aliasing in MICA

Figure 4:
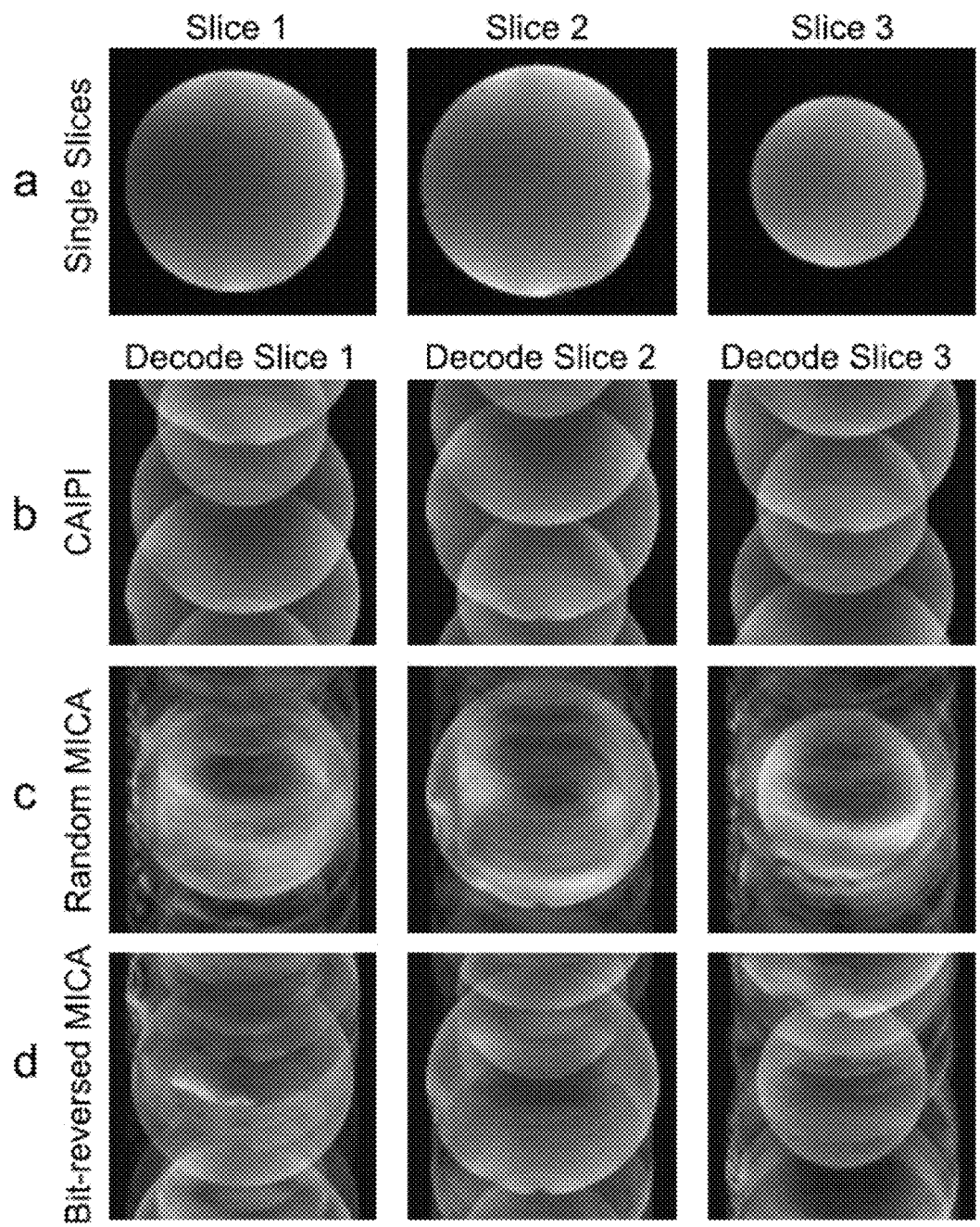
FIGS. 4a-d show 2D views of the slice-aliased data after decoding the encoding phase added to one of the simultaneously excited slices.

The incoherency of the slice-aliasing in MICA can be better appreciated by looking at the slice-aliased data after decoding the encoding phase added to one particular simultaneous slice. An example with 3 simultaneous slices is shown in FIGS. 4a-d. As a reference, the original single-slice images used in the simulation are displayed in FIG. 4a. Each row in FIG. 4b-d corresponds to the simulation of one data acquisition scheme and each column corresponds to the decoding of one simultaneous slice. The slice that has been decoded appear at the center of the FOV. In a CAIPI-type acquisition, the other two slices appear coherently shifted with respect to the slice that has been decoded, as shown in FIG. 4b. In MICA, the other two slices incoherently alias across the FOV, as shown in FIG. 4c-d. Random MICA (FIG. 4c) creates more incoherency than bit-reversed MICA (FIG. 4d).

SENSE Reconstruction for MICA

In MICA, the individual slices can be reconstructed by a SENSE reconstruction.

As a first step a 1D inverse FFT is conducted along the fully sampled $k_x$ dimension to transform the 3D data in the $k_x$-$k_y$-$\omega_z$ space into the x-$k_y$-$\omega_z$ space. For each point x=$x_0$ along x, there exists an undersampled $k_y$-$\omega_z$ plane. Each acquired point on the $k_y$-$\omega_z$ plane is measured by one echo. The signal measured in the c-th coil by the n-th echo is $$s_{MICA}(x = x_0, k_y(n), \omega_z(n), c) = \qquad [6]$$

$$\Sigma_{y=0}^{N_y-1} \Sigma_{z=0}^{N_s-1} m(x_0, y, z) S_c(x_0, y, z) e^{-i2\pi \frac{k_y y}{N_y}} e^{-i\omega_z(n)z}$$

$$(n = 0, 1, \ldots, N_e - 1; c = 0, 1, \ldots, N_c - 1),$$

where the phase $-\omega_z z$ is for sampling the frequency spectrum of the simultaneous slices. The other notations are the same as in the "SENSE Reconstruction for CAIPI" section. In matrix form, Eq. 6 can be written as $$s_{MICA} = E_{MICA} m. \qquad [7]$$

And Eq. 7 can be solved by $$m = \text{pinv}(E_{MICA}) s_{MICA}. \qquad [8]$$

$s_{MICA}$ is an $N_e N_c \times 1$ vector containing the measured data in the x-$k_y$-$\omega_z$ space, $s_{MICA}$ ($x_0$, $k_y(n)$, $\omega_z(n)$, c), where n=0, ..., $N_e$-1 is the echo index and c=0, ..., $N_c$-1 is the coil index. m is an $N_y N_s \times 1$ vector containing the unknown magnetization m($x_0$, y, z), where y=0, ..., $N_y$-1 and z=0, ..., $N_s$-1. $E_{MICA}$ is a $N_e N_c \times N_y N_s$ encoding matrix which contains the coil sensitivities and the DFT encoding along y and z. The 3D magnetization m(x, y, z) is reconstructed by performing Eq. 8 for each point along x.

Variations and Modifications

Encoding with Non-Linear Phase in Slice Direction for Improved Incoherency

In a general form, the phase used in MICA to encode the simultaneous slices can be written as $\phi$(n, z), where n(=0, 1, ... $N_e$-1) is the echo index and z(=0, 1 ... $N_s$-1) is the slice index. If $\phi$(n, z) is introduced by the $G_z$ gradient, it must be linear in z and can be written as $\phi$(n, z)=$\omega_z$(n)z. The description of MICA so far has assumed this linear dependency on z of the encoding phase $\phi$(n, z). However, if being introduced by multiband RF phase modulation, $\phi$(n, z) does not necessarily have a linear dependency on z. Using $\phi$(n, z) that is non-linear in z may lead to better incoherency in the slice-aliasing. The non-linear $\phi$(n, z) can be determined by generating a unique series of encoding phase for each z position using a random number generator or using alternative approaches that can create incoherent aliasing of the slices.

When the encoding is conducted with non-linear phase in z, the SENSE reconstruction can be applied to reconstruct the individual slices. A 1D inverse FFT can transform the acquired data into the x-$k_y$ space. At x=$x_0$, the data acquired by the n-th echo in the c-th receive coil can be written as $$s_{MICA}(x = x_0, k_y(n), c) = \qquad [9]$$

$$\Sigma_{y=0}^{N_y-1} \Sigma_{z=0}^{N_s-1} m(x_0, y, z) S_c(x_0, y, z) e^{-i2\pi \frac{k_y y}{N_y}} e^{-i\phi(n,z)}$$

$$(n = 0, 1, \ldots, N_e - 1; c = 0, 1, \ldots, N_c - 1).$$

In Eq. 9, the coil sensitivities $S_c$, the phase for DFT encoding along y, $-2\pi k_y y/N_y$, and the phase for encoding along z, $-\phi$(n, z), are all known. The magnetization m is the only unknown and can be solved by inverting the encoding matrix for each x position.

Incoherency in Time Dimension

Figure 5:
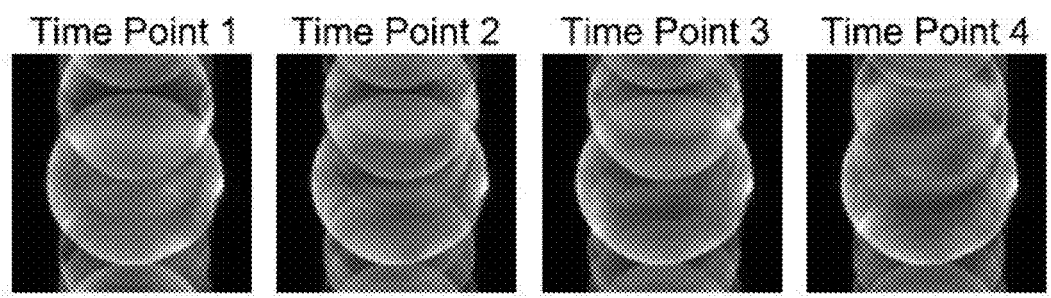
FIG. 5 is a 2D view of the slice-aliased data acquired by MICA with a varying encoding strategy for each time point, illustrating the variation in aliasing artifacts that can be produced.

Many SMS experiments, such as functional MRI (fMRI), diffusion tensor imaging (DTI) or high-angular-resolution diffusion imaging (HARDI) experiments, involve the acquisition of a time series or multiple images. Embodiments of the invention can be extended to introduce aliasing incoherency in the time domain in addition to the spatial domain. With the incoherency in the time dimension, the spatial-aliasing pattern changes with time, as depicted in FIG. 5.

Incoherency in the time dimension can be introduced by varying the encoding conducted on the simultaneous slices for successive image acquisitions. In other words, a phase of $\phi$(n, z, t) can be applied to encode the simultaneous slices, where n=0, 1, ... $N_e$-1 is the echo index, z=0, 1, ... $N_s$-1 is the slice index and t=0, 1, ... $N_t$-1 is the image acquisition index. For each image acquisition t=$t_0$, the encoding phase $\phi$(n, z, $t_0$) can have either linear or non-linear dependency on z. A possible choice for $\phi$(n, z, t) is to let $\phi$(n, z=$z_0$, t=$t_0$) equal to $\phi$(n, z=$z_0$, t=0) circularly shifted by $t_0 \times t_s$ points, where $t_s$ is a constant number controlling the size of the shifting step. We refer to such acquisition as MICA with a temporal shift of $t_s$. The 2D view of the slice-aliased data acquired by a MICA EPI acquisition with a temporal shift of 17 is displayed in FIG. 5. The aliasing pattern is incoherent both in space and time. $\phi$(n, z, t) has a linear dependency on z in this case.

For MICA with temporal shift, the acquired data in the x-$k_y$ space becomes $$s_{MICA}(x = x_0, k_y(n), c, t) = \qquad [10]$$

$$\Sigma_{y=0}^{N_y-1} \Sigma_{z=0}^{N_s-1} m(x_0, y, z) S_c(x_0, y, z) e^{-i2\pi \frac{k_y y}{N_y}} e^{-i\phi(n,z,t)}$$

$$(n = 0, 1, \ldots, N_e - 1; c = 0, 1, \ldots, N_c - 1, t = 0, 1, \ldots, N_t - 1).$$

Since the entire encoding matrix is known, the magnetization m can be solved by inverting the encoding matrix for each x position. m can be solved time point by time point, or can be solved by combining measurements from multiple adjacent time points.

MICA DTI and HARDI Acquisitions

MICA can be applied to DTI or HARDI data, where each time point acquires data under a unique diffusion weighting. If a temporally-varying encoding pattern is used to create incoherent aliasing that is varying in the temporal dimension, then we expect the g-factor, or noise amplification, to vary temporally. Improved tensor analyses could be obtained by using g-factors determined from the known encoding matrix at each time point by using these weights as a measurement of the data confidence. This embodiment will result in an overall improvement in the accuracy of the diffusion tensor analysis as the varying g-factor will help ensure no pixel ever sees constant high noise amplification.

Compressed Sensing in Reconstruction

The SENSE reconstruction utilizes the known information of the receive coil sensitivities and of the encoding scheme, but has not taken advantage of the incoherent aliasing in MICA. Compressed sensing may be incorporated into the reconstruction to better utilize the aliasing incoherency.

Results

MR images were acquired on a GE 3T MR750 scanner (GE Healthcare, Waukesha, Wis.) using a 32-channel head coil (Nova Medical, Wilmington, Mass.). Image reconstruction and computer simulations were performed in MATLAB (The MathWorks, Natick, Mass.).

Computer Simulation Results

Computer simulations of an embodiment were performed to validate the feasibility of MICA. The simulations used three single-slice axial images, which were acquired by a standard single-slice EPI acquisition. The acquisition parameters were: FOV, 19.2 cm; echo time, 38.6 ms; repetition time, 2 s; matrix size, 96×96; flip angle, 64°; slice thickness, 2 mm; number of averages, 1; bandwidth, 250 kHz. The distance between adjacent slices was 42 mm.

Figure 6:
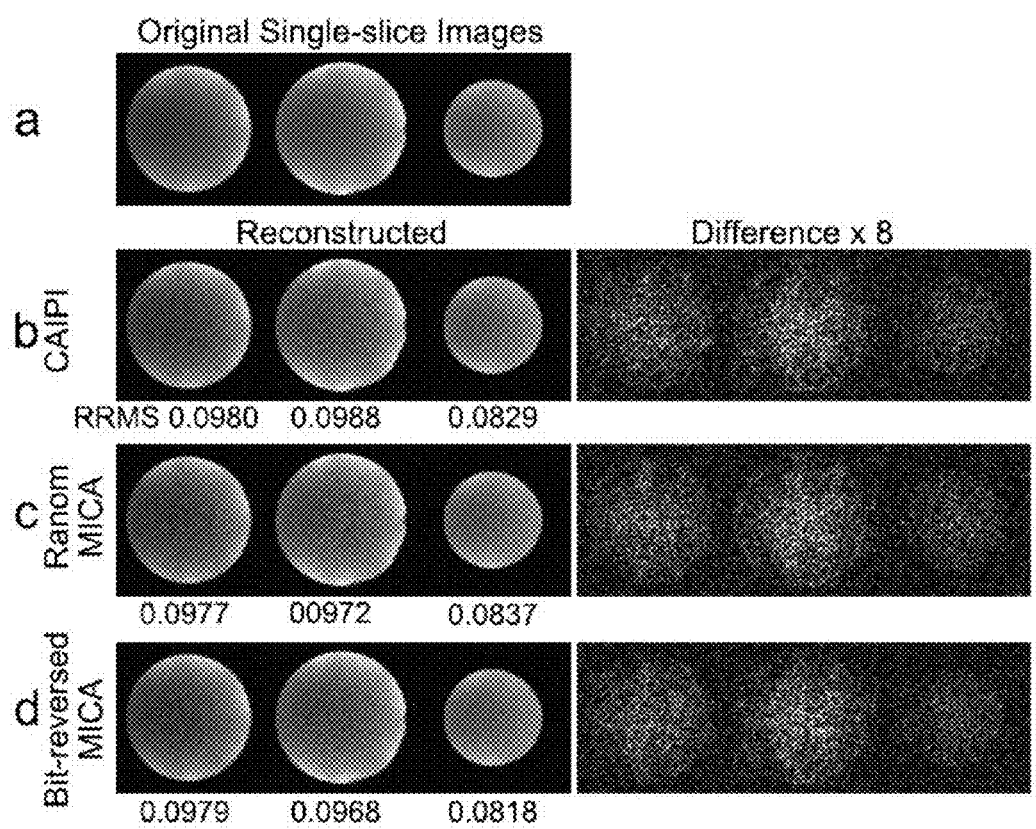
FIGS. 6a-d illustrate the results of a simulation of the CAIPI-type, the random MICA and the bit-reversed MICA acquisitions.

The CAIPI-type, the random MICA and the bit-reversed MICA acquisitions with 3× slice acceleration and 4× in-plane acceleration were simulated. The same Gaussian distributed noise was added to the simulated signal for each type of acquisition. The individual slices were reconstructed by the SENSE reconstruction. FIGS. 6a-d illustrate the results of the simulation. FIG. 6a shows original single-slice images. Reconstructed images and difference with respect to the original single-slice images for the CAIPI-type acquisition are shown in FIG. 6b, for the random MICA acquisition are shown in FIG. 6c, and for the bit-reversed MICA acquisition are shown in FIG. 6d. The relative root mean squared (RRMS) error between a reconstructed image and the corresponding original single-slice image was calculated and displayed under the reconstructed image. The images and RRMS error values in FIG. 6 demonstrate that the performance of MICA is comparable to CAIPI.

Phantom Results

Bit-reversed MICA and blipped-CAIPI acquisitions which had the same slice prescription, acceleration factor and scan parameters were performed. The slice-encoding in MICA was conducted by $G_z$ blips that were played out during the EPI readout. The acquisition parameters were: FOV, 22 cm; echo time, 30 ms; matrix size, 80×80; flip angle, 15°; slice thickness, 2 mm; number of averages, 1; bandwidth, 250 kHz. The gap between adjacent simultaneous slices was 32 mm, 32 mm, 25 mm, 20 mm and 17 mm for slice-acceleration factor of 3, 4, 5, 7 and 8, respectively. A short repetition time of 0.5 s was used because only three slices were prescribed.

The 32-channel data were compressed into 12-channel data before the SENSE reconstruction was conducted. The temporal SNR of each acquisition was calculated as the mean divided by the standard deviation of the signal level in the reconstructed images from 50 repeated acquisitions. The retained SNR, namely one over the geometry-factor, was calculated as the ratio of the temporal SNR of a slice-accelerated acquisition to a single-slice acquisition. The retained SNR maps were smoothed with a 3×3 voxel averaging kernel.

Figure 7:
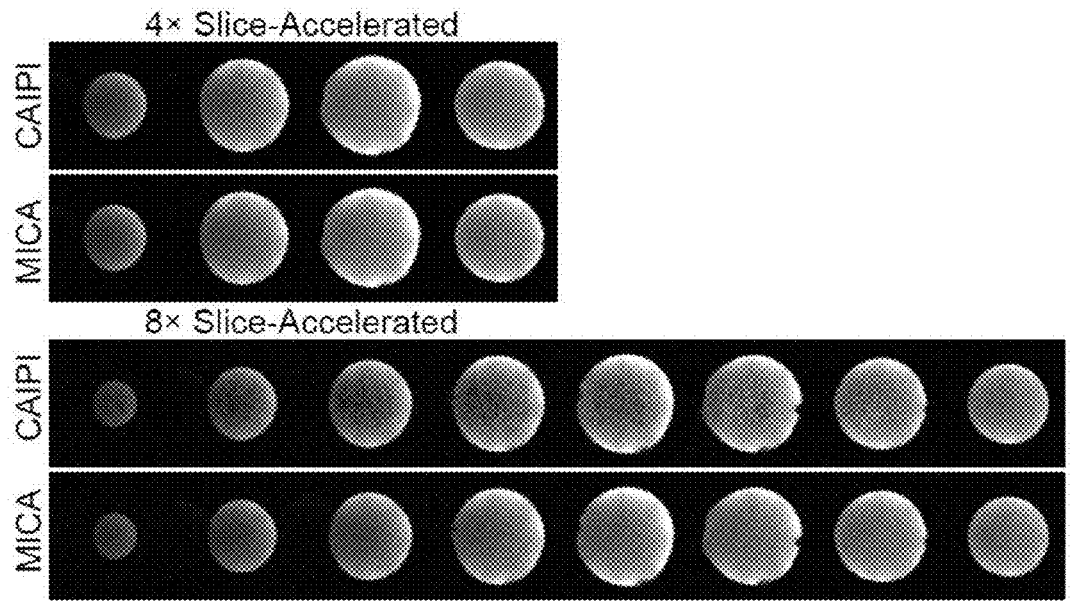
FIG. 7 displays the phantom images acquired by blipped-CAIPI and bit-reversed MICA sequences.

FIG. 7 displays the reconstructed images from blipped-CAIPI and bit-reversed MICA acquisitions with no in-plane acceleration and with 4 or 8 times slice-acceleration. Although the quality of the blipped-CAIPI and bit-reversed MICA images is comparable when 4 times slice-acceleration is applied, the MICA images exhibit higher SNR when the slice-acceleration factor increases to 8.

Figure 8:
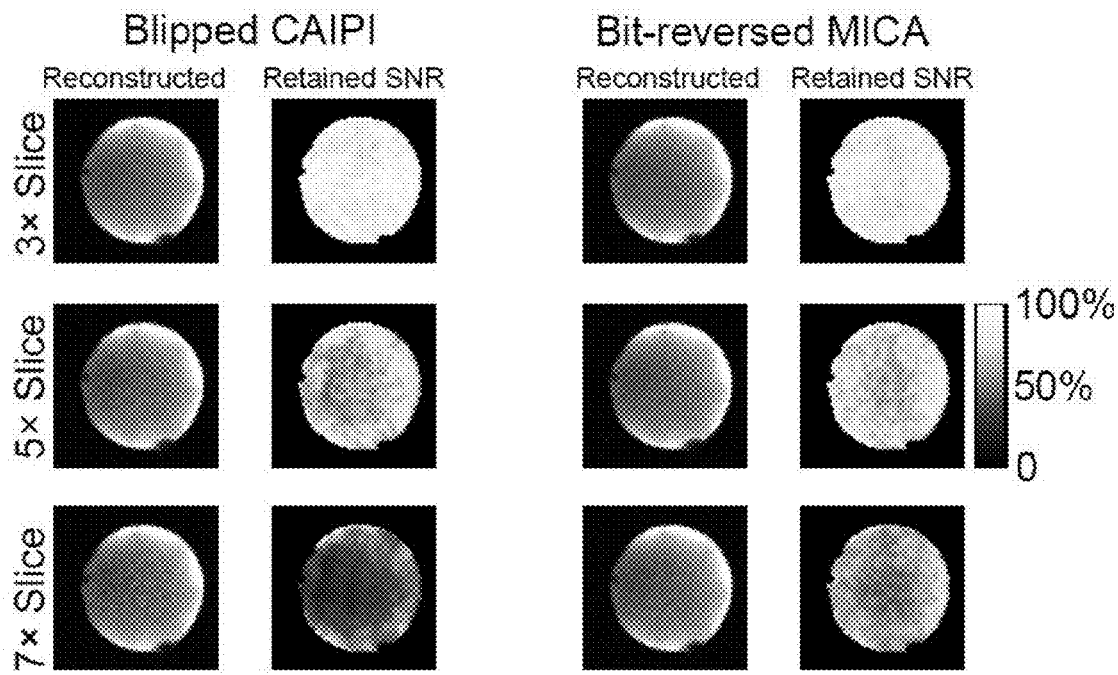
FIG. 8 displays the reconstructed image and corresponding retained SNR map of one slice under 3×, 5× and 7× slice-accelerations.

FIG. 8 further demonstrates that MICA retains more image SNR than CAIPI when no inplane acceleration is used and when the slice-acceleration factor is high, and that MICA has similar performance to CAIPI when the slice-acceleration factor is low. The images in FIG. 8 are from one of the simultaneous slices that are acquired by blipped-CAIPI or by bit-reversed MICA under 3, 5 or 7 times slice-acceleration and no in-plane acceleration. An image mask for the phantom area is generated basing on the signal level in the reconstructed image, and the retained SNR map inside the phantom is displayed. The grayscale bar for the retained SNR maps is displayed at the right side of the figure. The retained SNR average ±standard deviation inside the phantom for blipped-CAIPI is 0.91±0.13, 0.69±0.15 and 0.40±0.14 for slice-acceleration factor of 3, 5 and 7, respectively, while the corresponding values for bit-reversed MICA are 0.86±0.11, 0.74±0.14 and 0.59±0.10, which correspond to an average SNR improvement of −6.5% (SNR loss), 4.6% and 50.3%. For the acquisitions with 7 times slice-acceleration, the minimum retained SNR inside the phantom in bit-reversed MICA is higher than that in blipped-CAIPI by more than a factor of 2 (0.39 vs. 0.15), and MICA thereby provides more than 100% SNR improvement in the high noise amplification region.

In Vivo Results

Figure 9:
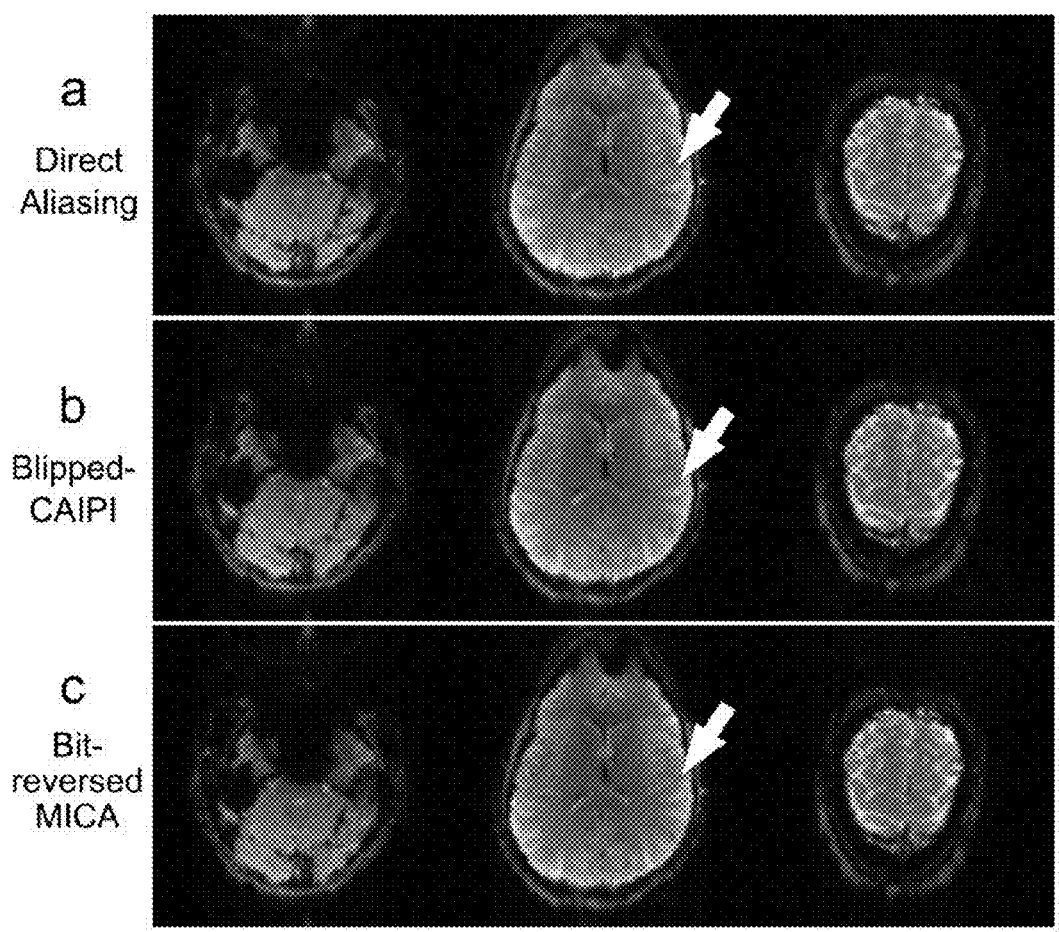
FIGS. 9a-c display the reconstructed brain images from one group of three simultaneous slices acquired by an SMS EPI acquisition and reconstructed by SENSE.

FIGS. 9a-c display the reconstructed brain images from one group of three simultaneous slices acquired by an SMS EPI acquisition and reconstructed by SENSE. FIGS. 9a-c correspond to directly aliasing the three slices together, a blipped-CAIPI acquisition with FOVy/3 shift between adjacent slices, and a bit-reversed MICA acquisition, respectively. Some artifacts seen in the directly aliased SMS acquisition do not exist in the blipped-CAIPI or bit-reversed MICA acquisition, as depicted by the white arrows. The image quality is comparable between blipped-CAIPI and bit-reversed MICA.

Advantages and Improvements Over Other Methods

MICA may provide superior encoding ability compared to the CAIPI-type acquisition for the following reason. The encoding matrix of a CAIPI-type acquisition for each x position consists of three parts: the coil sensitivities, the DFT encoding along y and the DFT encoding along z. If the coil sensitivities were ignored, the encoding matrix would be orthogonal, which means the "encoding efficiency" would be maximum. With the coil sensitivities included, however, the encoding matrix cannot be orthogonal anymore and the "encoding efficiency" is diminished. MICA allows the encoding along z to deviate from a DFT encoding, and thus may improve the condition number of the entire encoding matrix. The relative "encoding efficiency" of MICA with respect to a CAIPI-type acquisition would depend on the coil configuration, the specific acquisition parameters and the acceleration factors. MICA may perform better than CAIPI at high acceleration factor due to its more flexible encoding scheme.

MICA introduces incoherent aliasing of the simultaneous slices. The incoherency may be utilized by a compressed sensing reconstruction to improve the reconstruction performance.

MICA is not restricted by the number of RF pulses applied in the data acquisition, and can be used with both single-shot EPI acquisition and multishot acquisitions. When added by multiband RF phase modulation, the encoding phase term for the simultaneous slices can have a non-linear dependency on the slice index, which may lead to more incoherency of the aliasing.

The aliasing incoherency in MICA can be extended to the time dimension. By varying the slice encoding scheme for successive image acquisitions, residual spatial aliasing can be made incoherent with respect to time in an image time series. This may help improve the accuracy of the diffusion tensor model fitting in DTI or HARDI.

New Features

The new features provided by some embodiments of the invention include the following: 1) Incoherent aliasing of multiple simultaneously excited slices. 2) Taking randomly ordered samples on the interval $[0, 2\pi]$ of the continuous frequency spectrum of the simultaneously excited slices. 3) Encode the simultaneously excited slices with a phase that has non-linear dependency on the slice index with multiband RF phase modulation. 4) Incoherent aliasing with respect to time in a time series acquisition introduced by varying the encoding scheme for successive image acquisitions.

The requirements for one embodiment of the invention are as follows: 1) Excitation of multiple slices that are separated in the slice direction by multiband RF pulse. 2) Encoding of the simultaneously excited slices either by multiband RF phase modulation or by manipulation of the $G_z$ gradient. 3) Reconstruct the individual slices using a SENSE reconstruction or alternative reconstruction techniques.

General Application

Figure 10:
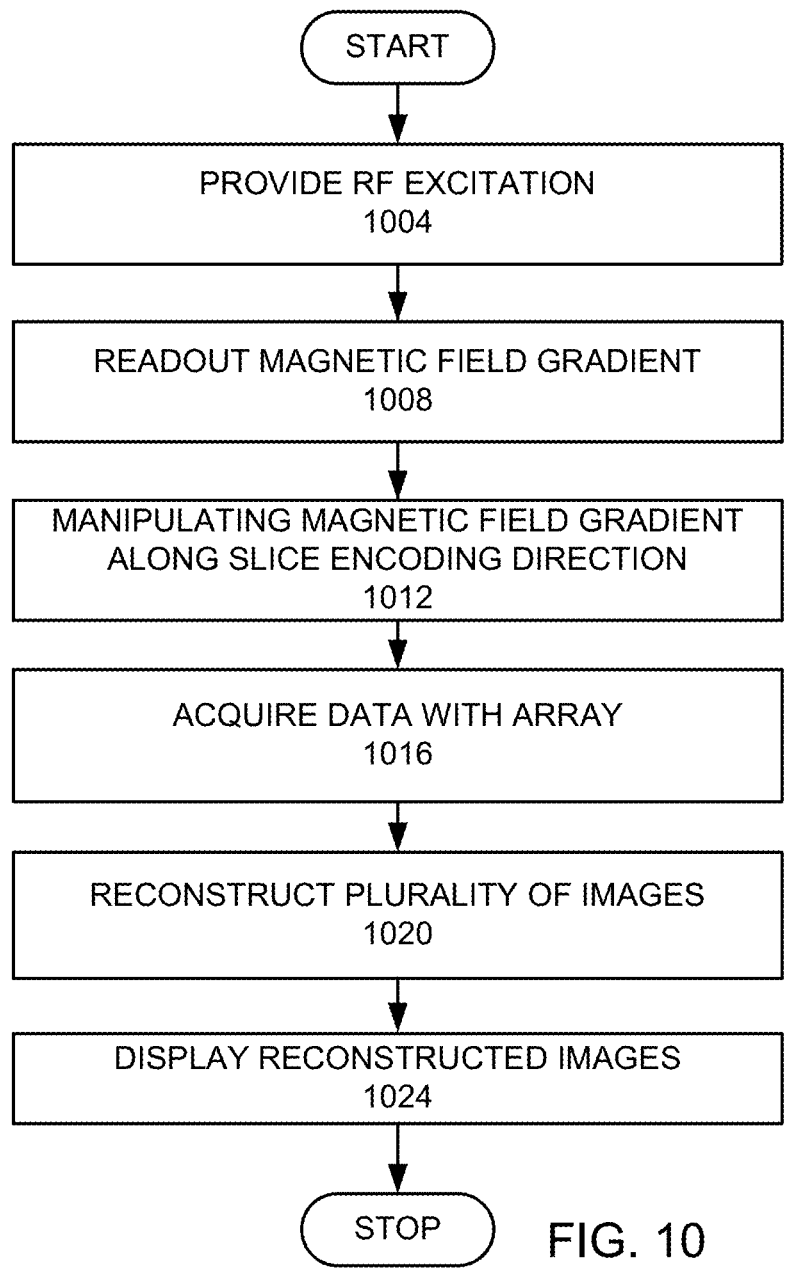
FIG. 10 is a flow chart of an embodiment of the invention.

To facilitate the understanding of the invention, FIG. 10 is a high level flow chart of an embodiment of the invention. An RF excitation is applied (step 1004). The RF excitation field is applied by an MRI system to at least a portion of a subject and includes a plurality of slice locations. The plurality of slice locations includes a current slice location and at least one adjacent slice location. A readout magnetic field gradient is established (step 1008). The MRI system establishes the readout magnetic field gradient along a frequency-encoding direction following the application of the RF excitation filed in order to form echo signals. A magnetic field gradient is established along a slice encoding direction. The MRI system manipulates the slice-encoding magnetic field gradient (step 1012) in order to impart a sequence of phase shifts to the formed echo signals such that image data corresponding to the at least one adjacent slice location is incoherently aliased across a FOV of the current slice location. Image data are acquired with an array of RF receiver coils that form part of the MRI system (step 1016). A plurality of images are reconstructed (step 1020). Each of the plurality of images depicts the subject at a corresponding one of the plurality of slice locations. The reconstructed images are displayed (step 1024).

Figure 11:
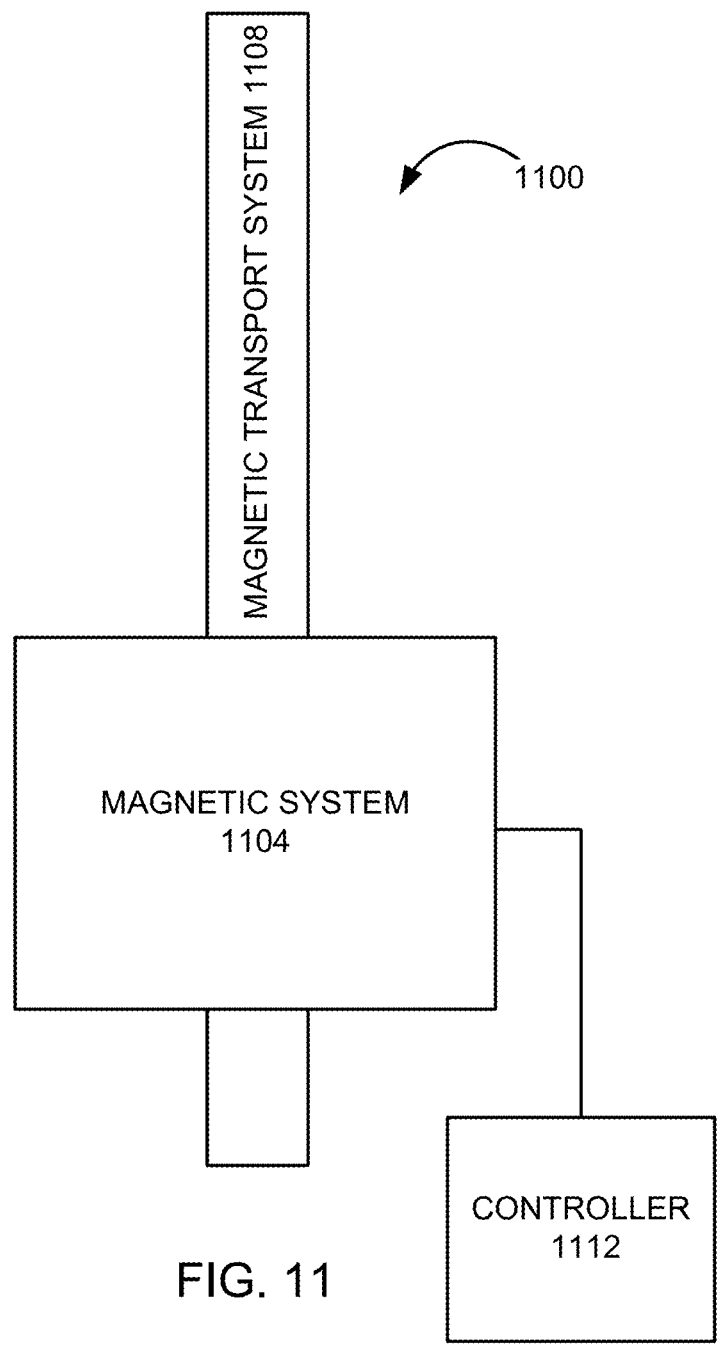
FIG. 11 is a schematic top view of a magnetic resonance imaging (MRI) system that may be used in an embodiment of the invention.

FIG. 11 is a schematic top view of a magnetic resonance imaging (MRI) system 1100 that may be used in an embodiment of the invention. The MRI system 1100 comprises a magnet system 1104, a patient transport table 1108 connected to the magnet system, and a controller 1112 controllably connected to the magnet system. In one example, a patient would lie on the patient transport table 1108 and the magnet system 1104 would pass around the patient. The controller 1112 would control magnetic fields and radio frequency (RF) signals provided by the magnet system 1104 and would receive signals from detectors in the magnet system 1104.

Figure 12:
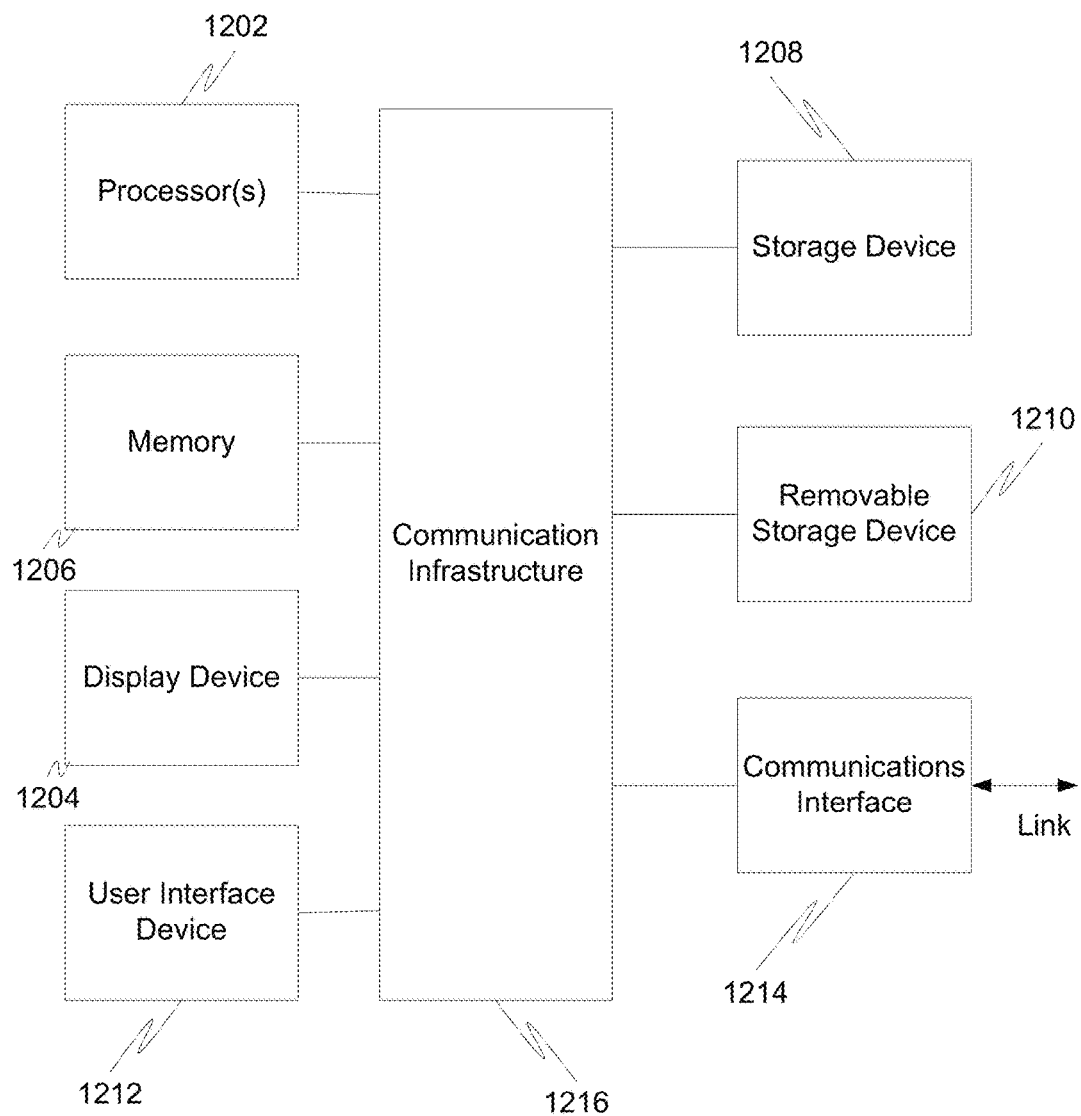
FIG. 12 illustrates a computer system that may be used in an embodiment of the invention.

FIG. 12 is a high level block diagram showing a computer system 1200, which is suitable for implementing the controller 1112 used in embodiments of the present invention. The computer system may have many physical forms ranging from an integrated circuit, a printed circuit board, and a small handheld device up to a huge super computer. The computer system 1200 includes one or more processors 1202, and further can include an electronic display device 1204 (for displaying graphics, text, and other data), a main memory 1206 (e.g., random access memory (RAM)), storage device 1208 (e.g., hard disk drive), removable storage device 1210 (e.g., optical disk drive), user interface devices 1212 (e.g., keyboards, touch screens, keypads, mice or other pointing devices, etc.), and a communication interface 1214 (e.g., wireless network interface). The communication interface 1214 allows software and data to be transferred between the computer system 1200 and external devices via a link. The system may also include a communications infrastructure 1216 (e.g., a communications bus, cross-over bar, or network) to which the aforementioned devices/modules are connected.

Information transferred via communications interface 1214 may be in the form of signals such as electronic, electromagnetic, optical, or other signals capable of being received by communications interface 1214, via a communication link that carries signals and may be implemented using wire or cable, fiber optics, a phone line, a cellular phone link, a radio frequency link, and/or other communication channels. With such a communications interface, it is contemplated that the one or more processors 1202 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

As described above, various methods may be used to provide incoherent aliasing. One method may use random phase shifts. Another method may use pseudo random phase shift. A random phase shift is a series of phase shifts that may be provided by a process, so that the phase shifts exhibit statistical randomness. Pseudo random phase shifts are phase shifts that may be according to a pattern, but provide sufficient incoherent aliasing.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for producing a plurality of images of a subject with a magnetic resonance imaging (MRI) system, the steps of the method comprising:
   a) applying, with the MRI system, a radio frequency (RF) excitation field in combination with a slice-select magnetic gradient field along a slice-select direction to a portion of a subject that includes a plurality of slice locations, the plurality of slice locations including a current slice location and at least one adjacent slice location;
   b) establishing, with the MRI system, at least one readout magnetic field gradient along a frequency-encoding direction and at least one phase encoding magnetic field gradient along a phase-encoding direction following the application of the RF excitation field in order to form at least one echo signal;
   c) manipulating the RF field in order to impart a sequence of phase shifts to the formed echo signals such that image data corresponding to the at least one adjacent slice location is incoherently aliased across a field-of-view (FOV) of the current slice location;
   d) acquiring, with an array of RF receiver coils that forms a part of the MRI system, image data indicative of the formed echo signals; and
   e) reconstructing a plurality of images of the subject from the acquired image data, each of the plurality of images depicting the subject at a corresponding one of the plurality of slice locations.

2. The method, as recited in claim 1, further comprising applying a spin refocusing RF field before establishing the at least one readout magnetic field gradient to form spin-echo signals.

3. The method, as recited in claim 1, wherein the acquiring of the image data and the reconstruction of a plurality of images of the subject from the acquired image data is repeated a selected number of times for the plurality of slice locations, where each repeated acquiring of the image data acquires image data for the plurality of slice locations.

4. The method, as recited in claim 3, further comprising applying one of a plurality of selected sequences of phase shifts to the formed echo signals during each repetition of acquiring image data for the plurality of slice locations, such that the image data corresponding to the at least one adjacent slice location is incoherently aliased in one of a plurality of selected ways for each repetition.

5. The methods, as recited in claim 4, further comprising estimating the signal to noise ratio (SNR) or its equivalent for each pixel in the reconstructed images in each repetition of data acquisition and using the values of the SNR or its equivalent as a measurement of data confidence in image post-processing and data analysis as the spatial distribution of image SNR changes depending on the selected sequence of phase shifts applied to the acquired echo signals used to form each image.

6. The method, as recited in claim 1, wherein to impart a sequence of phase shifts to the formed echo signals comprises manipulating the phase introduced to each one of the plurality of slice locations using the excitation or spin refocusing RF field.

7. The method, as recited in claim 6, wherein the manipulation of the RF excitation or spin refocusing field introduces selected phase shifts across the plurality of slice locations that are not a linear function of the slice position when the at least one echo signal is formed.

8. The method, as recited in claim 1, wherein to impart a sequence of phase shifts to the formed echo signals comprises manipulating the amplitude or area of a magnetic field gradient along a slice-select direction.

9. The method, as recited in claim 1, wherein the establishing at least one readout magnetic field gradient along a frequency-encoding direction and at least one phase encoding magnetic field gradient along a phase-encoding direction comprises establishing a plurality of alternating readout magnetic field gradient and establishing a phase encoding magnetic field gradient prior to each one of the alternating readout magnetic field gradient, such that a train of echo signals is formed.

10. The method, as recited in claim 9, further comprising sequentially applying a plurality of slice-encoding magnetic field gradient blips along a slice-select direction, each of the slice-encoding magnetic field gradient blips being played out substantially contemporaneously with a respective phase-encoding magnetic field gradient blip.

11. The method, as recited in claim 1, wherein the manipulation of the RF field introduces selected phase shifts across the plurality of slice locations that are a linear function of the slice position when the at least one echo signal is formed.

12. The method, as recited in claim 11, further comprising selecting samples to take and an order to take the samples in a three dimensional spatial frequency domain (k-space), based on information related to a spatial sensitivity of the array of RF receiver coils in the planes transverse to the slice-select direction at the plurality of excited slice locations.

13. The method, as recited in claim 11, wherein the at least one echo signal takes samples at randomly or pseudo-randomly selected locations along the slice-select direction in a three dimensional k-space.

14. The method, as recited in claim 1, further comprising applying additional RF fields and magnetic field gradients either before the RF excitation as a magnetization preparation step, or between the RF excitation and readout magnetic field gradient to create a desired image contrast.

15. The method, as recited in claim 1, further comprising estimating a sensitivity map for each RF receiver coil in the array of RF receiver coils and using the estimated sensitivity maps when reconstructing a plurality of images of the subject from the acquired image data by first conducting an inverse Fourier transform along a fully sampled dimension, and then inverting an encoding matrix for each spatial position along the fully sampled dimension.

16. The method, as recited in claim 1, wherein the reconstructing the plurality of images of the subject from the acquired image data comprises using iterative image reconstruction.

17. A method for producing a plurality of images of a subject with a magnetic resonance imaging (MRI) system, the steps of the method comprising:
   a) applying, with the MRI system, a radio frequency (RF) excitation field in combination with a slice-select magnetic gradient field along a slice-select direction to a portion of a subject that includes a plurality of spectral components, the plurality of spectral components including a current spectral component and at least one adjacent spectral component;

b) establishing, with the MRI system, at least one readout magnetic field gradient along a frequency-encoding direction and at least one phase encoding magnetic field gradient along a phase-encoding direction following the application of the RF excitation field in order to form at least one echo signal;

c) manipulating the RF field in order to impart a sequence of phase shifts to the formed echo signals such that image data corresponding to the at least one adjacent spectral component is incoherently aliased across a field-of-view (FOV) of the current spectral component;

d) acquiring, with an array of RF receiver coils that forms a part of the MRI system, image data indicative of the formed echo signals; and e) reconstructing a plurality of images of the subject from the acquired image data, each of the plurality of images depicting the subject at a corresponding one of the plurality of spectral components.

* * * * *